US012663462B2

(12) United States Patent
Abhishek et al.

(10) Patent No.: US 12,663,462 B2
(45) Date of Patent: Jun. 23, 2026

(54) ON-CHIP FAULT DETECTION DUE TO MALFUNCTIONS ON CHIP PINS

(71) Applicant: NXP USA, Inc., Austin, TX (US)

(72) Inventors: Kumar Abhishek, Bee Cave, TX (US); Neha Srivastava, New Delhi (IN); Vivek Kumar Yadav, Austin, TX (US); Sanjaykumar Hansrajbhai Kakasaniya, Austin, TX (US); Vikram Joshi, Austin, TX (US)

(73) Assignee: NXP USA, Inc., Austin, TX (US)

( * ) Notice: Subject to any disclaimer, the term of this patent is extended or adjusted under 35 U.S.C. 154(b) by 300 days.

(21) Appl. No.: 18/458,382

(22) Filed: Aug. 30, 2023

(65) Prior Publication Data

US 2024/0353479 A1     Oct. 24, 2024

(30) Foreign Application Priority Data

Apr. 19, 2023     (IN) .............................. 202311028531

(51) Int. Cl.
*G01R 31/28*          (2006.01)
*H03K 3/037*          (2006.01)
*H03K 19/20*          (2006.01)

(52) U.S. Cl.
CPC ......... *G01R 31/2884* (2013.01); *H03K 3/037* (2013.01); *H03K 19/20* (2013.01)

(58) Field of Classification Search
CPC ..... G01R 31/2884; H03K 3/037; H03K 19/20
USPC ................................................. 714/721, 733
See application file for complete search history.

(56) References Cited

U.S. PATENT DOCUMENTS

| | | | |
|---|---|---|---|
| 6,697,954 | B1 | 2/2004 | Stufflebeam |
| 8,510,593 | B2 * | 8/2013 | Adachi ..................... G06F 1/28 714/24 |
| 10,013,042 | B1 * | 7/2018 | Abhishek .................. G06F 1/28 |
| 11,119,153 | B1 * | 9/2021 | Srinivasan ......... G01R 31/3177 |
| 12,124,309 | B2 * | 10/2024 | Abhishek .................. G06F 1/30 |
| 2004/0113676 | A1 * | 6/2004 | Shin .................. H03K 19/00315 327/308 |
| 2013/0332758 | A1 * | 12/2013 | Sasaki ..................... G06F 1/324 713/322 |
| 2019/0120903 | A1 * | 4/2019 | Meyer ........... G01R 31/318541 |

(Continued)

OTHER PUBLICATIONS

U.S. Appl. No. 18/055,915, Abhishek, Kumar: "Fault Detection During Entry To or Exit From Low Power Mode", filed Nov. 16, 2022.

*Primary Examiner* — Albert Decady
*Assistant Examiner* — Osman M Alshack
(74) *Attorney, Agent, or Firm* — Joanna G. Geld

(57)          ABSTRACT

A first power supply pad is configured to provide a first power supply to a power domain of the SoC in which the first power supply pad is configured to receive the first power supply from a source external to the SoC. A first signal pad is configured to receive a power ready signal from external the SoC which indicates when the first power supply to the power domain is fully powered up. A first power detector is configured to provide a first power detected output, which, when asserted, indicates presence of a power supply voltage on the first power supply pad. A fault detection circuit coupled to the first power detector and the first signal pad is configured to generate a set of fault flags in response to monitoring a relationship between the first power detected output and a logic state of the power ready signal.

24 Claims, 7 Drawing Sheets

(56) References Cited

U.S. PATENT DOCUMENTS

| | | | |
|---|---|---|---|
| 2022/0100607 A1* | 3/2022 | Behl | .................... G06F 11/1474 |
| 2022/0308610 A1* | 9/2022 | Srinivasan | ......... G01R 31/2896 |
| 2023/0204656 A1* | 6/2023 | Demirci | .................... H03F 1/52 |
| | | | 330/2 |
| 2024/0264229 A1* | 8/2024 | Srinivasan | .......... G06F 11/2284 |

* cited by examiner

ON-CHIP FAULT DETECTION DUE TO MALFUNCTIONS ON CHIP PINS

CROSS-REFERENCE TO RELATED APPLICATIONS

This application claims the priority under 35 U.S.C. § 119 of India application No. 202311028531, filed on 19 Apr. 2023, the contents of which are incorporated by reference herein.

BACKGROUND

Field

This disclosure relates generally to integrated circuits, and more specifically, to on-chip fault detection due to malfunctions on chip pins.

Related Art

Chip architectures today have many safety features implemented to target various types of faults. For example, chip faults in logic and memory are typically targeting by Built-In Self Test (BIST) circuitry. Redundant circuits are also typically present for critical functional modules. However, one key are which is often assumed to be working are the pins (input/output circuits (IOs)) and the board connections. For example, if a Power on Reset (POR) signal received from off-chip arrives at a malfunctioning pin of the chip, it can lead to the chip coming out of reset when outside of a normal operating voltage range. This can lead to indeterminate behavior which can be detrimental, causing immediate failures or leading to future failures of the chip. Therefore, a need exists for improved fault detection at the chip pins.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As described above, malfunctions at the chip pins (i.e. chip pads) can lead to detrimental indeterminate behavior, which may lead to current or future failures. Therefore, in one embodiment, characteristics of the pads within the chip are observed to provide fault indicators which relate to possible faults. The faults may cause current failure or future failure. In one embodiment, the chip pads configured to receive reset signals are monitored to determine fault indicators. These reset signals provide an indication as to when one or more power supplies to the chip are powered up and ready for operation. For example, these reset signals include a Power-on-Reset (POR) signal used upon powering up the chip as well as those used for powering up from low power modes. In general these monitored reset signals can be any signal received at a pad of the chip which transition logic states to indicate when one or more power supplies to the chip are powered and ready for operation.

Figure 1:
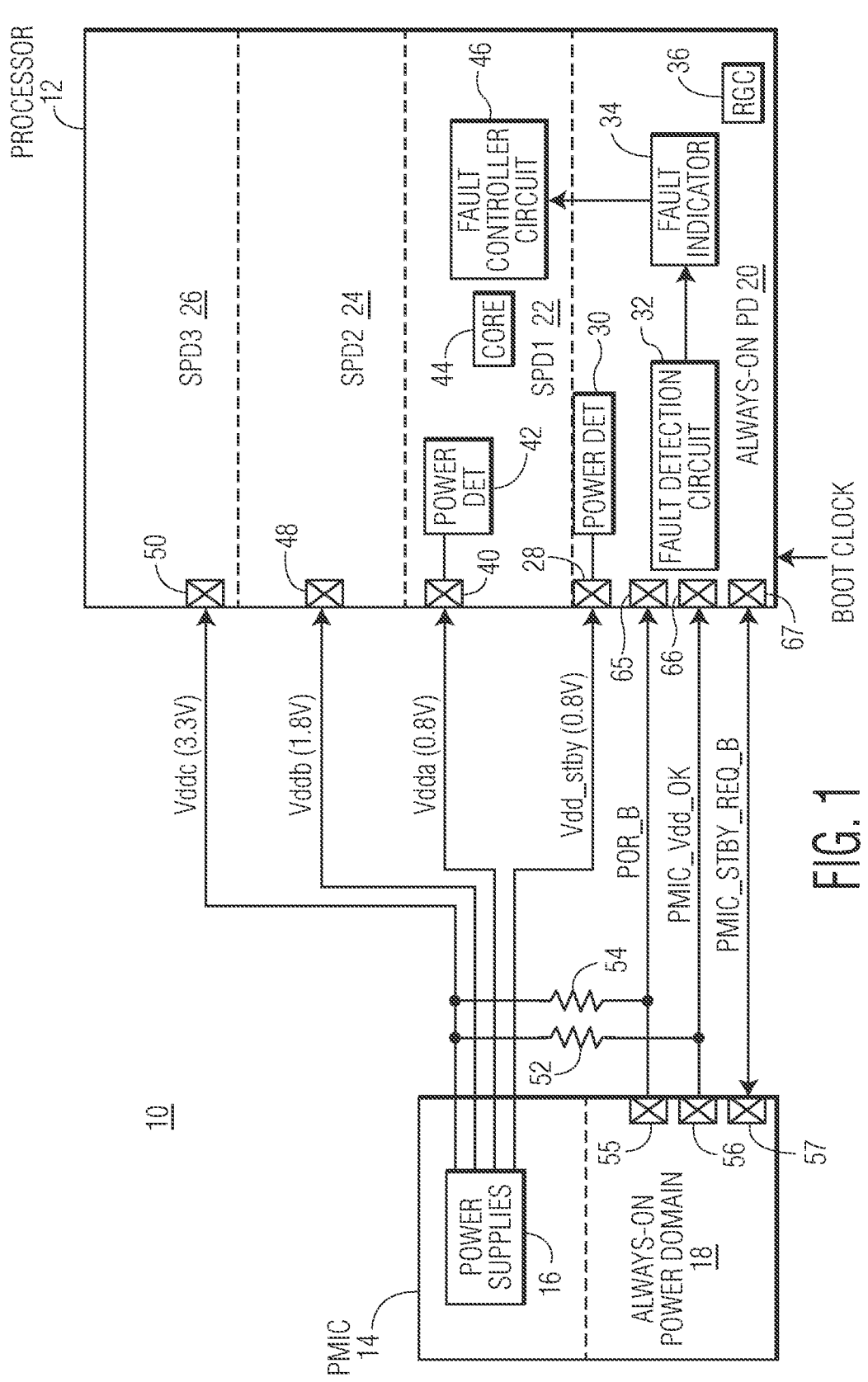
FIG. 1 illustrates, in block diagram form, a data processing system having a processor and a power management integrated circuit (PMIC) external to the processor, in accordance with one embodiment of the present invention.

FIG. 1 illustrates, in block diagram form, a data processing system 10 which includes a processor 12 and a power management integrated circuit (PMIC) 14. Note that processor 12 may be referred to as a chip or as a System-on-Chip (SoC) and can be divided into any number of power domains, including an always-ON power domain (PD) 20, and any number of switchable power domains (SPDs) such as SPD1 22, SPD2 24, and SPD3 26 (which may be referred to as just SPD1, SPD2, and SPD3, respectively). An SPD is a power domain whose power is removed or turned off during a low power mode, such as standby mode. An SPD is therefore powered by a power supply voltage (e.g. Vdda, Vddb, Vddc) which is capable of being gated (which may be done by gating the power supply from the circuitry of the power domain or turning off the power supply to the power domain). Therefore, the voltage supply of the SPD may be referred to as a switchable power supply. For example, Vdda is provided as the switchable power supply for SPD1, Vddb is provided as the switchable power supply for SPD2, and Vddc is provided as the switchable power supply for SPD3. Always-ON PD 20 is always powered and continues to run during a low power mode or standby mode, and is therefore powered by an always-on power supply voltage, Vdd_stby, which remains on during low power or standby mode (and may therefore also be referred to as a continuous power supply voltage). Also, as used herein, standby mode is considered a low power mode in which power is decreased or turned off for one or more SPDs.

SPD1 includes a signal pad 40 configured to receive switchable power supply voltage Vdda which powers circuitry within SPD1. In the illustrated embodiment, SPD1 includes a power supply detector 42 (referred to as a power det 42) coupled to pad 40 which detects the presence of a power supply voltage at pad 40. SPD1 also includes a processing core 44 and a fault controller circuit 46. SPD1 may also include additional circuitry, as needed. SPD2 includes a signal pad 48 configured to receive switchable power supply voltage Vddb which powers circuitry within SPD2, and SPD3 includes a signal pad 50 configured to receive switchable power supply voltage Vddc which powers circuitry within SPD3. SPD2 and SPD3 can include any type of circuitry, as needed, such as additional processing cores, accelerators, etc. Also, processor 12 can include any number (one or more) SPDs in addition to always-ON PD 20. In one embodiment, each of Vdda, Vddb, and Vddc provides a different voltage when powered up. For example, Vdda provides 0.8V when powered up, Vddb provides 1.8V when powered up, and Vddc provides 3.3V when powered up. However, the switchable power supplies can provide different voltage levels than these examples, and some of the switchable power supplies may also supply the same voltage level when powered up. Each of the SPDs can be powered up, as needed, based on a power mode of processor 12. In one embodiment, when in standby mode, only always-ON PD 20 is powered up, and none of the other SPDs are powered. Also, note that always-ON PD 20 remains powered up during any low power mode of processor 12.

Always-ON PD 20 includes a signal pad 28 configured to receive the continuous power supply voltage Vdd_stby, which provides 0.8V in the illustrated embodiment. Always-ON PD 20 also includes a power supply detector 30 (referred to as power det 30) coupled to pad 28 which detects the presence of a power supply voltage at pad 28. Always-ON PD 20 also includes signal pads 65, 66, and 67, as well as a reset generation circuit (RGC) 36, a fault detection circuit 32, and a fault indicator 34. In one embodiment, RGC 36 may generate a reset signal to the power domains of processor 12 to reset processor 12 based on the POR_B signal received at pad 65. Power det 30 operates as a crude power supply detector which simply detects the presence of a supply voltage by determining whether or not the voltage on pad 65 has reached a predetermined detection threshold voltage. For example, this predetermined threshold may be about half of the voltage level of the corresponding power supply when fully powered. Therefore, if Vdd_stby is fully powered at 0.8V, then the predetermined detection threshold voltage for power det 30 may be 0.4V. Alternatively, a different voltage level between 0V and the power level when fully powered can be used as the threshold. Fault detection circuit 32 is coupled to pads 65, 66, and 67 and is coupled to receive the outputs of power supply detectors 42 and 30. Fault detection circuit 32 can also be coupled to any other signal pads or power detector outputs, as needed.

In one embodiment, fault indicator 34 corresponds to storage circuitry, which may be implemented, for example, as registers, to store fault indicators or flags generated by fault detection circuitry 32. In one embodiment, upon exiting standby mode, fault control circuitry can receive and process the fault indicators or flags from fault indicator 34. Signal pad 65 is configured to receive a POR signal, POR_B, signal pad 66 is configured to receive a Vdd ready signal, PMIC_Vdd_OK, and signal pad 67 is configured to provide a standby mode request signal, PMIC_STBY_REQ_B. These signals are communicated between processor 12 and PMIC 14 (which is external to processor 12, i.e. located off chip). POR_B and PMIC_Vdd_OK are received from PMIC 14 and PMIC_STBY_REQ_B is provided to PMIC 14. Note that any signal name followed by a "_B" indicates that the signal is an active low signal which, when asserted, is a logic level low (i.e. logic level zero) and when negated, is a logic level high (i.e. logic level one).

Each of signal pad 65-67, 28, 40, 48, and 50 may also be referred to as chip pads or chip pins, or as external pads or external pins, or simply as pads or pins. Each of pads 28, 40, 48, and 50 may be referred to more specifically as a voltage supply pad or pin, or as a voltage supply node, for their corresponding power domain. For ease of explanation, each of the voltage supply pads or voltage supply nodes may be referred to by the corresponding supply voltage (e.g., Vdd_Stby, Vdda, Vddb, Vddc, etc.). Each of the power supply pads receives a corresponding supply voltage from an external voltage source (external to processor 12, i.e. external to the SoC), such as from PMIC 14, to power the corresponding power domain (i.e. to provide the corresponding supply voltage to the corresponding power domain).

Signal pads 65-67 each include the signal pad as well as a corresponding input/output (IO) circuit and may each be implemented as a general purpose IO (GPIO). Note that the IO circuit corresponding to each of the signal pads includes circuitry to implement the input function, output function, or both the input and output functions, as needed, of the signal pad, such as pull-up circuitry, pull-down circuitry, input and output buffers, electro-statice discharge (ESD) circuits, etc. For example, in one embodiment, for each GPIO, the corresponding signal pad can be coupled to a positive voltage supply terminal or ground, as needed, to provide an output data signal (OutD) when an output buffer enable (OBE) signal is asserted for the GPIO. The corresponding signal pad of a GPIO can receive an input data signal (IND) when an input buffer enable (IBE) signal is asserted for the GPIO. Each GPIO can also include ESD circuitry coupled between the signal pad and each of the supply voltage terminals to protect against damage from ESD events, as known in the art. (Since the signals and specific structure of the GPIOs can be implemented and used as known in the art, they are not illustrated in detail so as not to complicate the drawings.) Also, note that the pad of each GPIO may be just an input pad, just an output pad, or both and input/output pad.

In the illustrated embodiment, each of Vdda, Vddb, and Vddc are considered switchable power supply voltages, which can be gated from the GPIOs or powered down during standby so as to reduce leakage power in the pad ring of processor 12. Pad 65 is coupled via a pull-up resistor 54 to Vddc, which may supply a system-level (e.g. board-level) supply voltage (at, e.g., 3.3V). Pad 66 is also coupled via a pull-up resistor 52 to Vddc. Note that in the illustrated embodiment, Vddc is always ON during low power modes and feeds power to the GPIO 3.3V supply of pads 65-67.

PMIC 14 includes an always-ON power domain 18 which includes signal pads 55-57 which communicate the corresponding signal with signal pads 65-67 of processor 12, respectively. Therefore, pad 55 provides POR_B to pad 65 of processor 12, pad 56 provides PMIC_Vdd_OK to pad 66 of processor 12, and pad 57 receives PMIC_STBY_REQ_B from pad 67 of processor 12. Always-on power domain 18 may include any circuitry, as needed, that requires continuous power. PMIC 14 can also include any number of switchable power domains, as needed, and includes power supplies 16 which supplies the power supply voltages to other elements of system 10. For example, power supplies 16 may include a set of voltage regulators which generate the appropriate power supply voltage levels for Vdd_stby, Vdda, Vddb, and Vddc to processor 12 based on a main voltage supply, such as a battery (not shown). PMIC 14 receives requests from processor 12 to transition power modes, and PMIC 14 provides the appropriate power supply voltages to safely control these power mode transitions.

Note also that processor 12 and PMIC 14 may each include more elements and power domains than those illustrated in FIG. 1. For example, processor 12 may include one or more cores, one or more memories, one or more peripherals, etc. Also, there may be additional signals communicated between processor 12 and PMIC 14 than those illustrated. For example, there may be more signal pads in the always-ON power domains of each of processor 12 and PMIC 14 to communicate additional control signals.

In the illustrated embodiment, POR_B is a one bit signal which, when asserted to a logic level zero indicates entry into reset and when released (i.e. negated) to a logic level one indicates that exit from reset has begun and can continue with further states of a reset sequence (i.e. reset procedure). In operation, upon entering reset, PMIC 14 asserts POR_B and begins the reset procedure and begins powering up the power supply voltages to processor 12. Once all power supplies are powered up, PMIC 14 releases (i.e. negates) POR_B (transitioning POR_B from zero to one), at which point processor 12 can continue with further states of the reset sequence (e.g. starting the boot clock, fuse loading, etc.) to safely enter into normal mode (i.e. normal operation) in which all the power supplies are properly (i.e. fully) powered.

In the illustrated embodiment, PMIC_Vdd_OK is also a one bit signal which operates similar to a reset signal when exiting standby mode by also indicating when the power supplies are ready (fully powered). For example, during operation, processor 12 may assert PMIC_STBY_REQ_B (to a logic level zero) to request entry into standby mode. In response, PMIC 14 begins to power down the switchable power supplies (e.g. Vdda and Vddb), and when they are powered down (e.g. to 0V), PMIC 14 negates PMIC_Vdd_OK to a logic level zero to indicate that the power supplies are powered down (and thus no longer ready for normal operation). Upon a wakeup event received, for example, by processor 12, processor 12 negates PMIC_STBY_REQ_B (to a logic level one) to indicate to PMIC 14 a request to exit from standby mode. In response, PMIC 14 begins a wakeup procedure and begins powering up the switchable power supplies. Once the switchable power supplies are fully powered, PMIC 14 asserts PMIC_Vdd_OK (transitioning PMIC_Vdd_OK from a logic level zero to a logic one), at which point processor 12 can safely exit standby mode and enter normal mode (i.e. normal operation) in which all the power supplies are properly (i.e. fully) powered.

Note that both POR_B and PMIC_Vdd_OK, upon a transition from zero to one in the above examples, indicate that the power supplies are ready to enter normal mode, i.e. are fully powered and ready for normal operation. As used herein, normal mode or normal operation for a power domain refers to completing the reset sequence followed by entering the run condition in which the power domain is fully powered. Similarly, normal mode or normal operation for processor 12 refers to being fully powered up in which all power supplies to processor 12 are fully powered. Therefore, each of the POR_B and PMIC_Vdd_OK signals may be referred to as a power ready signal, and thus each of pads 65 and 66 of processor 12 may be referred to more specifically as power ready pads or power ready pins. The power ready signals may also be referred to as reset signals since they are used during a reset (e.g. a power-up type reset, a wakeup from standby mode reset, etc.). Note that in alternate embodiments, depending on how a particular power ready signal is implemented (e.g. as an active high or active low signal), a transition of one to zero can instead indicate that one or more corresponding power supplies are ready. Note also that in alternate embodiments, this information can be transferred using multi-bit signals rather than one-bit signals.

Due to problems or malfunctions which can occur at the pads of processor 12, such as the power ready pads, the power ready signals at the pads as well as the corresponding supply voltages at the voltage supply pads can be monitored by fault detection circuit 32 to indicate fault flags (in which each fault flag may corresponding to an occurrence of a problematic situation or malfunction). For example, one fault may result when a power ready pad, such as POR pad 65, is shorted on the board to Vddc. In this case, POR pad 65 would be "stuck at high" and thus generate an always high state (a constant logic level one), which is provided to RGC 36. However, this can lead to the boot clock starting prematurely, when the supply voltages are still out of range. In another example, the power ready pad may be correctly connected on the board, but another fault may result during power up, such as if the POR_B signal at pad 65 resolves at a higher resolution voltage than the detection threshold voltage of the corresponding power detection circuit (e.g. power det 30). That is, the power det 30 may indicate the presence of power before the POR_B signal properly resolves (at a higher voltage) at pad 65, which may also result in the boot clock starting prematurely or may result in the boot block starting and stopping in an indeterminate fashion. These type of situations can similarly be problematic for the PMIC_Vdd_OK signal at pad 65 of processor 12. These problematic situations and the determination of such faults by fault detection circuit 32 will be described in further detail in reference to the waveforms of FIGS. 2-4 and block diagrams of FIGS. 5-7 below.

Figure 2:
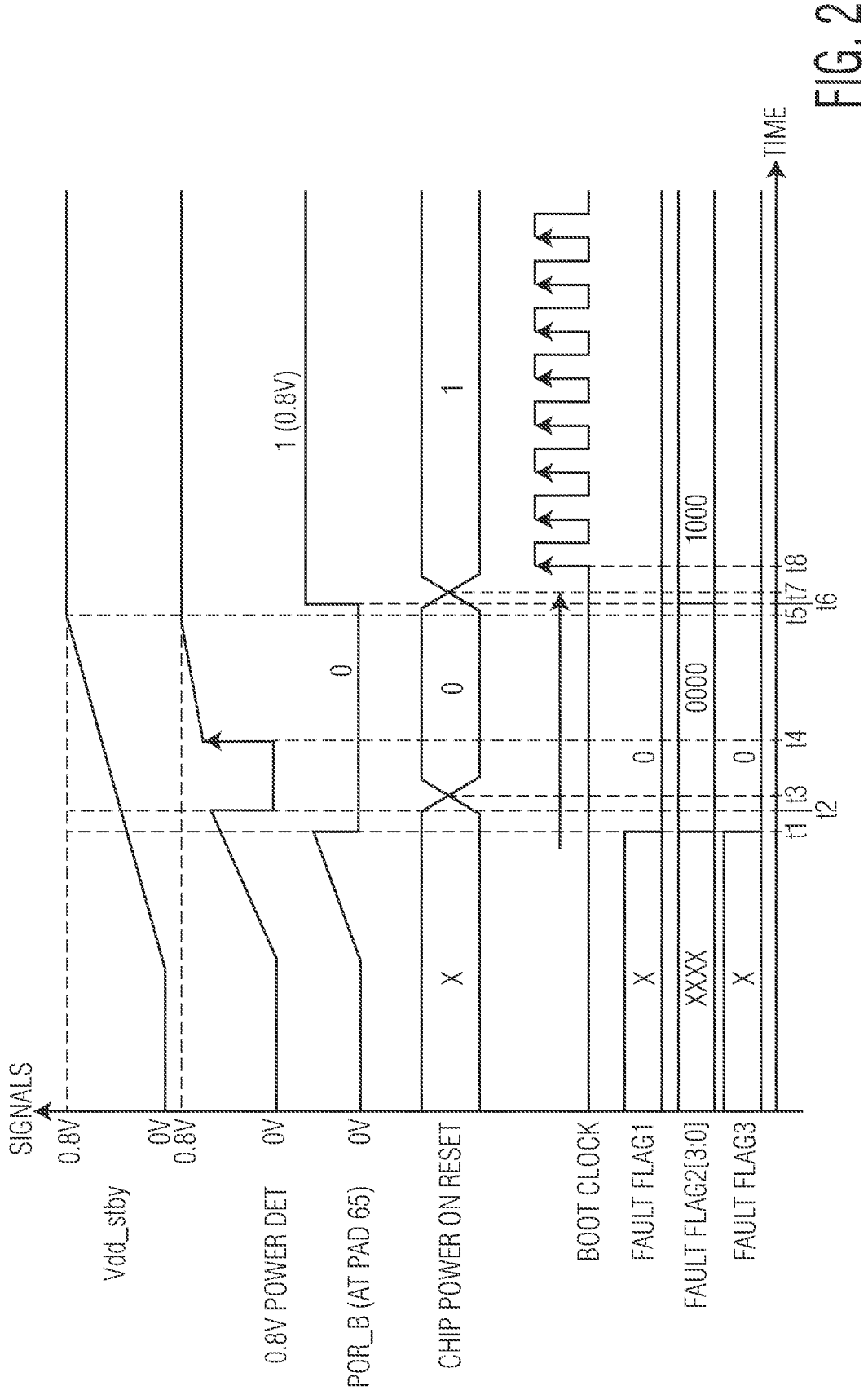
FIGS. 2-4 illustrate waveforms of various signals within the data processing system of FIG. 1, in accordance with embodiments of the present invention.

FIG. 2 illustrates waveforms for Vdd_stby, the output of power det 30, POR_B at pad 65 of processor 12, the chip power on reset which may be provided by RGC 36, and the boot clock, in accordance with one example. FIG. 2 also illustrates waveforms for three different fault flags: one-bit Fault FLAG1, 4-bit Fault FLAG2, and one-bit Fault FLAG3. These may simply be referred to as FLAG1, FLAG2, and FLAG3, respectively. Each fault flag corresponds to a different problematic situation or malfunction which can result in a current fault or failure, or a future fault or failure. These flags are detected by fault detection circuit 32 and provided for storage into fault indicator 34. In the example of FIG. 2, no fault is detected, in which, FLAG1 and FLAG 3 remain negated (at a logic level zero), and FLAG2 at most includes one asserted bit while the rest remain zero (e.g. 4'b1000, in which the "4'b" preceding a value indicates a 4-bit binary value). Each of these flags will be described in reference to the other waveforms of FIG. 2, in which the waveforms represent correct behavior (thus resulting in no faults detected).

For the correct behavior as illustrated in FIG. 2, upon powering up, POR_B provided to pad 65 from PMIC 14 is asserted at a logic level zero, and PMIC 14 begins ramping up all the power supplies. In FIG. 2 only Vdd_stby is illustrated (which, in the current example, reaches 0.8V when fully powered), but other supplies (e.g. Vdda, Vddb, Vddc) would also be ramping up to their respective full voltages. Since only Vdd_stby is illustrated, only the output of the corresponding power detector which monitors Vdd_stby (power det 30) is illustrated, but any of the other supplies may also have a corresponding power detector for monitoring their voltage levels. While Vdd_stby is ramping up, the IO circuit at pad 65 cannot initially distinguish a logic state of the signal, therefore, as illustrated in FIG. 2, prior to time t1, POR_B is in an indeterminate state. Similarly, the chip power on reset (which may be generated by RGC 36 based on POR_B), as well as FLAG1, FLAG2, and FLAG3 are also all in indeterminate (i.e. unknown) states. The boot clock is also not yet started.

At time t1, the IO circuit at pad 65 is sufficiently powered by Vdd_stby to be able to sample and discern a logic state of the received POR_B (e.g., meaning that Vdd_stby is greater than a voltage supply threshold). Therefore, at time t1, POR_B provided at pad 65 to the chip (i.e. processor 12) is sampled as a logic level zero (since POR_B is in the asserted state at a logic level zero by PMIC 14). In response to POR_B being sampled at a logic level zero, the fault flags are all driven to logic level zeros (since no fault has yet been detected) and the chip power on reset signal is also set to a logic level zero.

A power detector, such as power det 30, is configured to monitor the voltage level at pad 28 and provide an indication as to whether or not the presence of a power supply is detected. For example, for power det 30, its output is at a logic level zero until the voltage on pad 28 reaches a predetermined detection threshold voltage (e.g. 0.4V), at which point its output is asserted to a logic level one to indicate the presence of a power supply corresponding to Vdd_stby at pad 28 (indicating only the presence of a power supply but not indicating that Vdd_stby has reached its fully powered voltage level). As with the IO circuit at pad 65, though, as the voltage supplies are being ramped up, the IO logic at pad 28 is not initially capable of discerning whether a voltage level on pad 28 is less than or greater than a particular threshold, therefore, the output of power det 30 is also initially indeterminate. At time t2, though, Vdd_stby is sufficiently powered up to determine the lack of or presence of a power supply, and thus is no longer indeterminate. Therefore, at time t2, the output of power det 30 is negated to a zero since Vdd_stby has not yet reached the predetermined detection threshold voltage (e.g. 0.4V). At a later time t4, upon reaching the predetermined detection threshold voltage, the output of power det 30 is asserted to a logic level one, and it continues tracking Vdd_stby (as a logic high state) as the Vdd_stby continues ramping up to its full powered voltage level.

In this example, time t1 corresponds to the time at which Vdd_stby is sufficiently powered such that the voltage at pad 65 ceases to be indeterminable and can be determined to be at a particular logic state. In one example, if the voltage at pad 65 is at a voltage level greater than a high predetermined threshold voltage, then the logic state corresponds to a logic level one, and if it is at a voltage level less than a low predetermined threshold voltage, then the logic state corresponds to a logic level zero. Note that each of the high and low predetermined threshold voltages are between zero and the voltage level which corresponds to a logic level one for the signals at pads 65 and 66. In the illustrated example, the POR_B signal of FIG. 2 represents the internal IO input signal (the logic side output to processor 12) whose logic level one state corresponds to 0.8V. The high predetermined threshold voltage (e.g. 2.6V) may be higher than the low predetermined threshold voltage (e.g. 0.7). However, in an alternate embodiment, they may be the same threshold level. In the illustrated embodiment, time t2 corresponds to the time at which the presence of a power supply can be detected at pad 28 based on whether the voltage level at pad 28 is higher or lower than the predetermined detection threshold (e.g. 0.4V). In the illustrated embodiment, t1 leads t2, however, in alternate embodiments t2 may lead t1. That is, the output of power det 30 may be detected as 0V prior to POR_B being detected as 0V. Note that only once the output of power det 30 is asserted to indicate the presence of a power supply at pad 28 and POR_B at pad 65 is determined to be released (i.e. negated) is the boot clock started, which ensures that processor 12 can safely enter normal operation (with its voltage supplies being within the expected voltage ranges for normal operation).

Referring still to FIG. 2, at time t5, Vdd_stby is fully powered up at 0.8V. Once all power supplies are fully powered and PMIC 14 has begun its reset procedure (corresponding to time t6), PMIC 14 releases (i.e. negates) POR_B to a logic level one, which corresponds to 0.8V in the illustrated example. The release of POR_B indicates to processor 12 that the power supplies are fully powered and ready to safely complete the reset sequence, followed by normal operation. Once POR_B is released at time t6, the chip power on reset is asserted to a logic level one (at time t7), and the boot clock begins (at time t8) with the voltage supplies all at the correct voltage levels (i.e. in their expected voltage ranges). Since no faults were detected during the power up sequence, FLAG1 and FLAG3 remain negated at zero. FLAG2 is an N-bit value (4-bit value in the illustrated embodiment) which indicates how many times POR_B has transitioned from a logic level zero to a logic level one. If system 10 is operating correctly, as in the example of FIG. 2, POR_B transitions only once from a logic level zero to a logic level one upon power up. The number of ones in FLAG3 corresponds to the number of times a transition from a zero to one logic state was detected. Therefore, since FLAG3 only includes a single "1", with the rest of the bits being "0", POR_B correctly transitioned only once from a logic level zero to a logic level one. Additional details with respect to how the flags operate will be described below.

Figure 3:
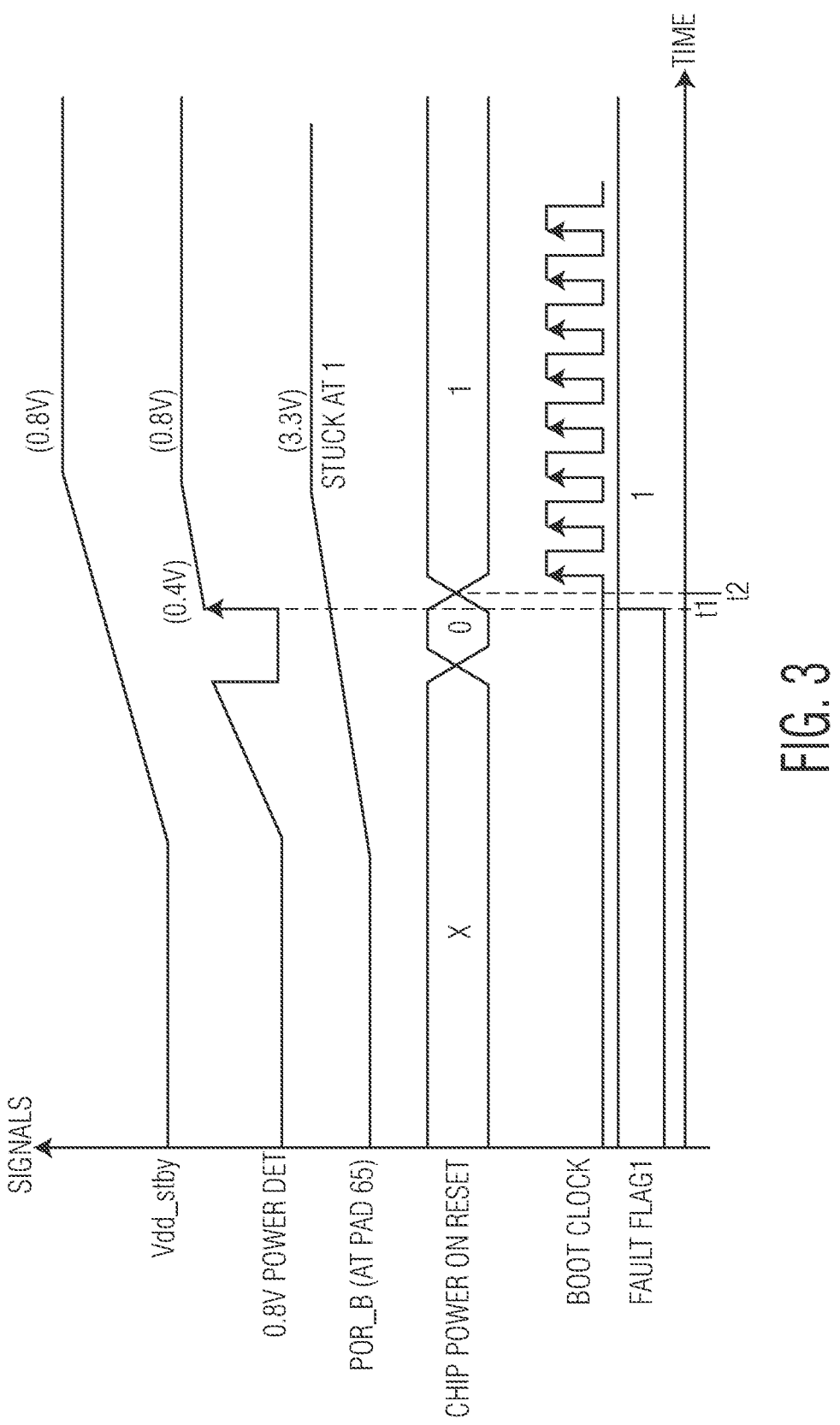

FIG. 3 illustrates a problem which may occur with respect to POR_B at pad 65 which, when detected by fault detection circuit 32, results in the assertion of fault FLAG1, in accordance with one embodiment of the present invention. (Note that FIG. 3 illustrates the same signals as those in FIG. 2, with the exception of FLAG2 and FLAG3.) For the waveforms of FIG. 3, it is assumed that the POR_B pad is shorted on the circuit board to a supply. In this case, POR_B is stuck at a logic level one, which results in processor 12 attempting to enter normal operation while the voltage supplies are still out of range. As described above in reference to FIG. 2, upon power up, PMIC 14 asserts POR_B to a logic level zero and begins ramping up all the power supplies (such as illustrated with Vdd_stby). Unlike the situation in FIG. 2, in which POR_B is sampled as a logic level zero once the IO circuit at pad 65 is sufficiently powered to discern logic states on pad 65, pad 65 in FIG. 3 is never sampled as a logic level zero. That is, because it is stuck at a logic level high (e.g. at 3.3V in the illustrated embodiments), as soon as the IO circuit at pad 65 is sufficiently powered to discern a logic state, POR_B on pad 65 is sampled as a logic level one as it continues to ramp up to 3.3V. Therefore, in this case, processor 12 may incorrectly assume that it may safely enter normal operation and thus begin the boot clock.

As illustrated in FIG. 3, at time t1, the output of power det 30 is asserted to indicate the presence of a power supply voltage at pad 28. However, at this time, POR_B should be asserted to a logic level zero by PMIC 14 while PMIC 14 is preparing the voltage supplies (i.e. ramping up the voltage supplies to be fully powered for entry into normal mode). In the example of FIG. 3, though, as soon as power det 30 indicates the presence of a power supply voltage at time t1, POR_B is incorrectly sampled as having been released (i.e. negated) because it is improperly stuck at 3.3V (and since it is stuck in this manner, there is also no indeterminate state on pad 65.) In this case, since it seems, by processor 12, that both a power supply has been detected on pad 28 and that POR_B has been released, the chip power on reset is released (to a logic level one) at time t2, followed by starting the boot clock. However, this causes the boot clock to prematurely start. Since at this time the power supplies are still ramping and are not yet at their fully powered levels, the boot clock should not yet being operating (i.e. oscillating). When the boot clock begins prematurely in this manner, faults can occur in processor 12 because the power supplies are out of range for guaranteeing safe and proper operation. Therefore, at time t1, fault detector circuit 32 asserts fault FLAG1 to indicate occurrence of this problematic situation. Further details will be provided with respect to the block diagrams below.

Figure 4:
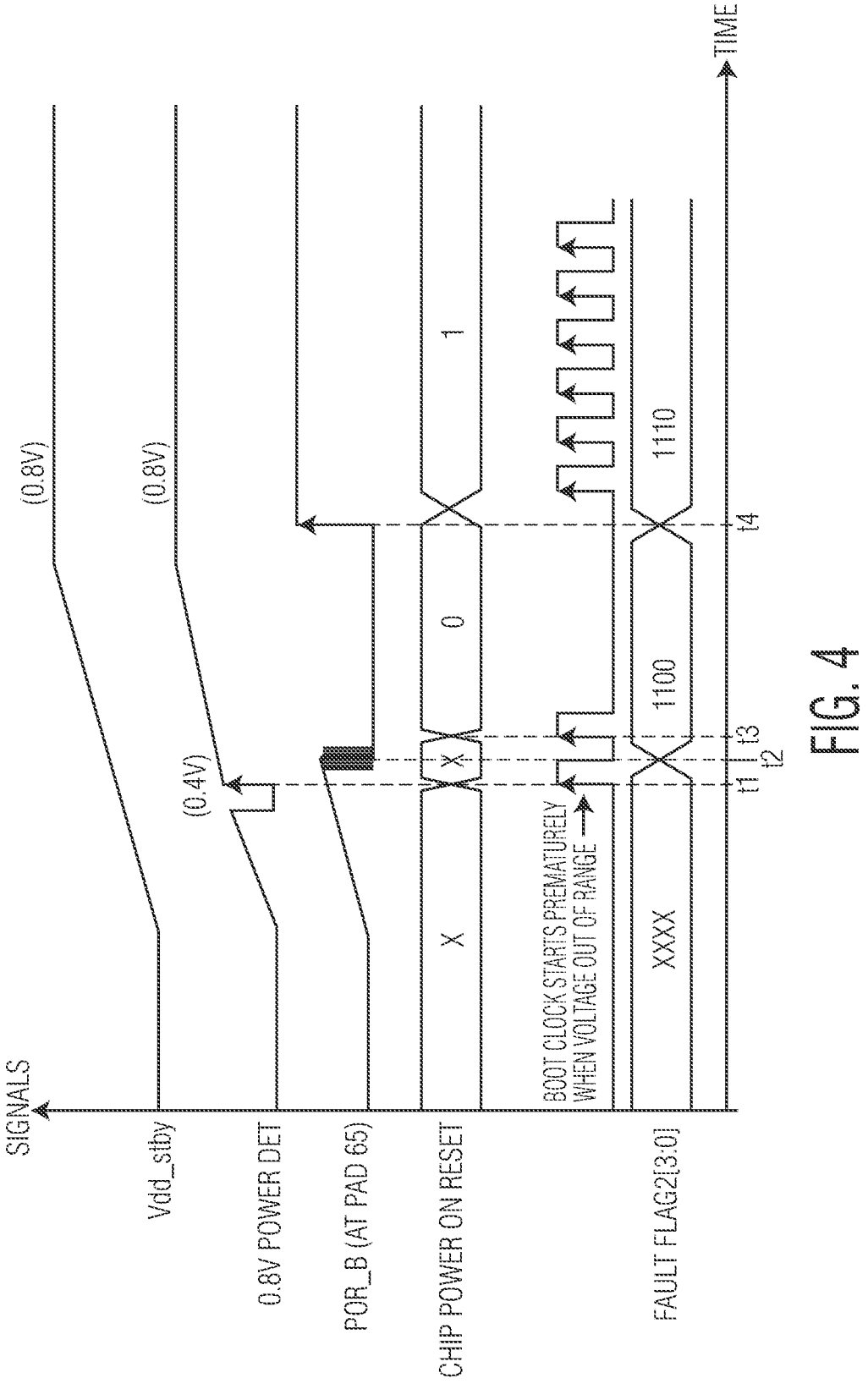

FIG. 4 illustrates another problem which may occur with respect to the POR_B signal and power det 30 which, when detected by fault detection circuit 32, results in setting the bits of FLAG3 in such a manner as to indicate a fault, in accordance with one embodiment of the present invention. (Note that FIG. 4 illustrates the same signals as those in FIG. 2, with the exception of FLAG1 and FLAG3.) In the example of FIG. 4, while the POR_B signal is not stuck at one as was the case in FIG. 3, the POR_B signal on pad 65 may take too long to resolve such that it resolves too long after power det 30 resolves (by detecting presence of a power supply). In the example of FIG. 4, Vdd_stby may be sufficiently powered, prior to time t1, to be negated to indicate lack of a power supply at pad 28, and then, at time 1, asserted to indicate the presence of a power supply at pad 28. However, at time t2, Vdd_stby may not be sufficiently powered to allow the IO circuit at pad 65 to properly settle to provide a logic level zero, to accurately reflect the received POR_B signal. This may occur, for example, due to aging of the circuits in processor 12.

At time t1, when the output of power det 30 has been asserted, processor 12 may incorrectly sample the voltage at pad 65 as a logic level one (because the IO circuit is not yet sufficiently powered). This may again result in prematurely starting the boot clock. This also results in the chip power on reset to remain indeterminate since the POR_B signal is not yet sampled at zero. Furthermore, the signal at pad 65 may be unstable and may be detected as a series of glitches. Only after the signal at pad 65 settles can POR_B properly be sampled as a zero. In this case, the boot clock may be stopped again, but there was still a time period in which the boot clock was prematurely oscillating. Also, the glitches can be detected as multiple zero to one logic state transitions of POR_B. As described above in reference to FIG. 2, if system 10 is operating correctly, then upon power up, there should only be one zero to one logic state transition of POR_B. In this case, only one bit of FLAG2 is asserted. However, in the example of FIG. 4, due to the glitches, more than one bit of FLAG2 is asserted, providing the 4-bit value of FLAG2 as 4'b1100 at time t2 and 4'b1110 at time t3. Therefore, although POR_B is properly released at time t4, resulting in assertion of the chip power on reset and the correct start of the boot clock, the instability on pad 65 for POR_B indicates a possible impending failure due to aging. In this case, the information obtained from FLAG2 can be used to determine how severe the problem becomes over time and appropriate mitigation can be taken before failure.

While the above examples have described problems with POR_B at pad 65, similar problems can occur with PMIC_Vdd_OK at pad 66. That is, analogous to POR_B, PMIC_Vdd_OK may also be incorrectly stuck at high or pad 66 may also be unstable due to aging. This may result in incorrect information being provided about any of the switchable power supplies (e.g. indicating they are fully powered and ready upon wakeup when they are not, etc.) or may indicate impending failure due to aging. Therefore, in the descriptions of FIGS. 5-7, signals such as POR_B and PMIC_Vdd_OK, will be referred to as power ready signals since each of the signals indicate when power supplies are properly powered up. Similarly, pads of processor 12 which receive these power ready signals, such as POR_B pad 65 and PMIC_Vdd_OK pad 66, will be referred to as a power ready pad of processor 12.

A set of fault FLAG signals (such as FLAG1, FLAG2, and FLAG3) to indicate fault occurrences can therefore be generated by fault detection circuit 32 with respect to any power ready signal and can be generated based on monitoring relationships between the power ready signal (e.g. by monitoring the logic state of the power ready signal) at the corresponding power ready pad and a voltage level of a corresponding power supply pad during a power up sequence or a wakeup sequence. For example, FLAG1, FLAG2, and FLAG3 described in FIGS. 2-4, may be generated by fault detection circuit 32 based on monitoring, in real-time, relationships between POR_B and the output of power det 30 (which corresponds to power supply pad 28 which receives Vdd_stby). Another set of one or more FLAG signals can be generated by fault detection circuit 32 based on monitoring, in real-time, relationships between PMIC_Vdd_OK and the output of a power detector which corresponds to one of the switchable power supplies (e.g. power det 42 which corresponds to pad 40 which receives Vdda). Furthermore, the monitoring (e.g. sampling) of these signals is performed in real-time, without delays, and at the moment a fault is indicated, the fault detection circuit is locked so that the indicated fault is not lost. In this manner, any detected fault can be properly captured by fault indicator 34 to be processed by fault controller circuit 46. Faults are therefore indicated by fault detection circuit 32 based on problematic relationships or scenarios detected with the power ready signal at the corresponding power ready pad and the corresponding power supply pad, as will be described in reference to the examples of FIGS. 5-7.

Figure 5:
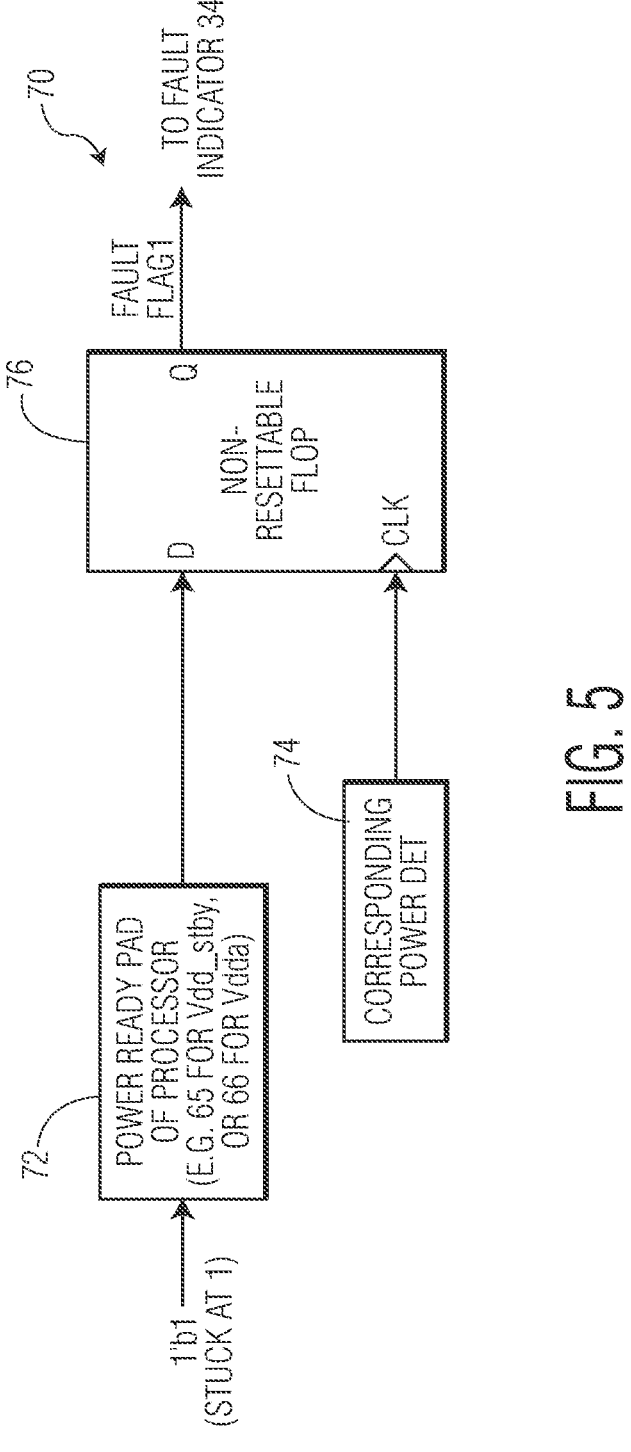
FIGS. 5-7 illustrates, in block diagram form, portions of a fault detection circuit of the processor of FIG. 1, in accordance with one embodiment of the present invention.

FIG. 5 illustrates, in block diagram form, a portion 70 of fault detection circuit 32, in accordance with one embodiment of the present invention, which detects the fault corresponding to fault FLAG1, and selectively asserts FLAG1 accordingly. As described above in reference to FIG. 3, FLAG1 is asserted when the power ready signal (e.g. POR_B) is stuck at high (i.e. at a logic level one). (Note that a corresponding fault FLAG1 can be generated for any power ready signal, e.g., corresponding fault FLAG1 signals can be generated for each of POR_B and PMIC_Vdd_OK.) Portion 70 includes a power ready pad 72 of processor 12, a corresponding power detector (det) 74, and a non-resettable flop 76. Pad 72 may correspond to either POR_B pad 65 or PMIC_Vdd_OK pad 66, and corresponding power det 74 can be the power supply detector corresponding to the power supply pad of a power domain being monitored. Therefore, in the case of pad 65, corresponding power det 74 corresponds to power det 30 which monitors Vdd_stby at pad 28, and in the case of pad 66, corresponding power det 74 may correspond to power det 42 which monitors Vdda at pad 40.

Non-resettable flop is implemented as a D flip flop without a reset input. A data input (D) is coupled to pad 72 (which is stuck at a high, i.e. at a logic level one), a clock input (clk) is coupled to receive the output of corresponding power det 74, and a data output (Q) is configured to provide Fault FLAG1 to fault indicator 34. In operation, upon an active edge (e.g. rising edge) of a clock signal at its clock input, a D flip flop stores the data value at the D input (corresponding to a logic state of the data value) and provides this stored value at its Q output. A non-resettable flop does not include a reset input to reset the Q output. Fault detection circuit 32 may include multiple instantiations of portion 70, one corresponding to each pad of processor 12 and corresponding power supply pad being monitored for pad issues. For example, one instantiation may monitor POR_B at pad 65 and Vdd_stby at pad 28, while another may monitor PMIC_Vdd_OK at pad 66 and Vdda at pad 40. In this example, a corresponding fault FLAG1 would be provided from each instantiation.

In the illustrated example of FIG. 5, it is assumed that pad 72 is stuck at a logic level one. The notation "1'b1" indicates one bit with a binary value of one, in which "1'b" indicates one bit, and the ending "1" is the bit value of the one bit. When the corresponding power det 74 is asserted to a logic level one (indicating that a power supply has been detected at pad 72), the value (i.e. logic state) at D gets latched and provided as Q. Therefore, at the time the corresponding power det 74 is asserted, the power ready signal at pad 72 should not be at a logic level one, but should initially be at a logic level zero, transitioning to a logic level one only once the power supplies have been sufficiently powered. In this case, only if a zero is latched upon assertion of the output of power det 74 is no fault indicated, which can only occur if pad 72 is not stuck at high (i.e. at a logic level one). If pad 72 is stuck at high, though, as illustrated, then a fault is indicated upon assertion of the output of power det 74. Since flip flop 76 is non-resettable, portion 70 of fault detection circuit 32 is locked so as not to lose the information provided by fault FLAG1.

Figure 6:
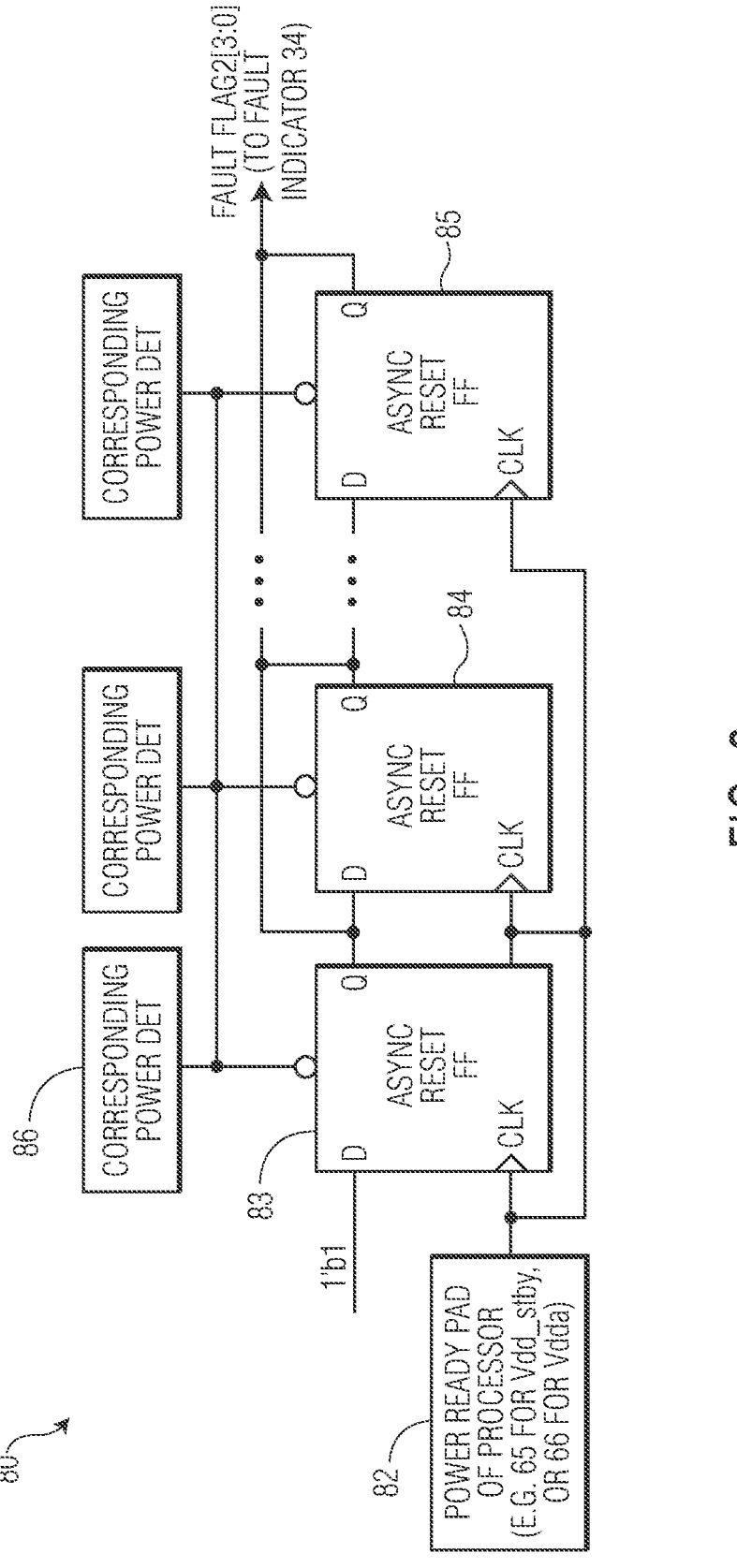

FIG. 6 illustrates, in block diagram form, a portion 80 of fault detection circuit 32, in accordance with one embodiment of the present invention, which detects the fault corresponding to FLAG2, and asserts the bits of FLAG2 accordingly. As described above in reference to FIG. 3, FLAG2 can be used to indicate that the power ready pad (e.g. POR_B pad 65) has instability at low voltages and therefore indicates aging or design weakness. Portion 80 includes a power ready pad 82 of processor 12, asynchronous reset flip flops 83-85, and a corresponding power detector (det) 86. Like pad 72, pad 82 may correspond to either POR_B pad 65 or PMIC_Vdd_OK pad 66, and corresponding power det 86 can be the power detector corresponding to the power supply pad of a power domain being monitored. Therefore, in the case of pad 65, corresponding power det 86 may correspond to power det 30 which monitors Vdd_stby at pad 28, and in the case of pad 66, corresponding power det 86 may correspond to power det 42 which monitors Vdda at pad 40.

Portion 80 includes N chained asynchronous reset flip flops 83-85, in which N is the number of bits of Fault FLAG2. In the illustrated embodiment, N is four, such that there are four flip flops, each providing one bit of FLAG2 [3:0], which is provided to fault indicator 34 for storage. The asynchronous reset flip flops are implemented as D flip flops, whose operation is described above, but further include an asynchronous reset (R) input in which, when an input to the R input is asserted, the flip flop is reset to store and output a zero, independently of the clock input. In the illustrated embodiment, each flip flop has an inverted R input such that the Q output of the flip flop is reset when an input to the R input is asserted at a logic level zero (rather than a logic level one). A D input of the first flip flop in the chain is configured to receive a fixed logic level one (as indicated by "1'b1"). Each of the other flip flops in the chain has a D input coupled to the Q output of the previous flip flop of the chain. A clk input of each flip flop in the chain is coupled to pad 82, such that a rising edge (a transition of a logic level zero to a logic level one) at pad 82 triggers the logic values at the D inputs to be latched. Each of the Q outputs of the N flop flops provides the N-bit value of FLAG2.

In operation, with any logic level zero to logic level one transition of the power ready signal at pad 82, a "1" is shifted into the chain of flip flops. Initially, power det 86, prior to detecting the presence of a power supply voltage on pad 82, provides a zero to each of the R inputs, resetting all Q outputs to zero. Since only one transition from a logic level one to a logic level zero of the power ready signal is expected, if system 10 is operating correctly, as was described above, the passing case is indicated when FLAG2 [3:0]=1000, indicating only a single "1" was shifted in due to a single transition of pad 82. The failing case is indicated when FLAG2 [3:0] includes more than one "1" (e.g. 1100, 1110, etc.), which indicates multiple logic level one to logic level zero transitions. Since the flip flops of the chain of flip flops do not get reset once a power supply is detected by corresponding power det 86, portion 80 of fault detection circuit 32 is locked so as not to lose the information provided by fault FLAG2.

Figure 7:
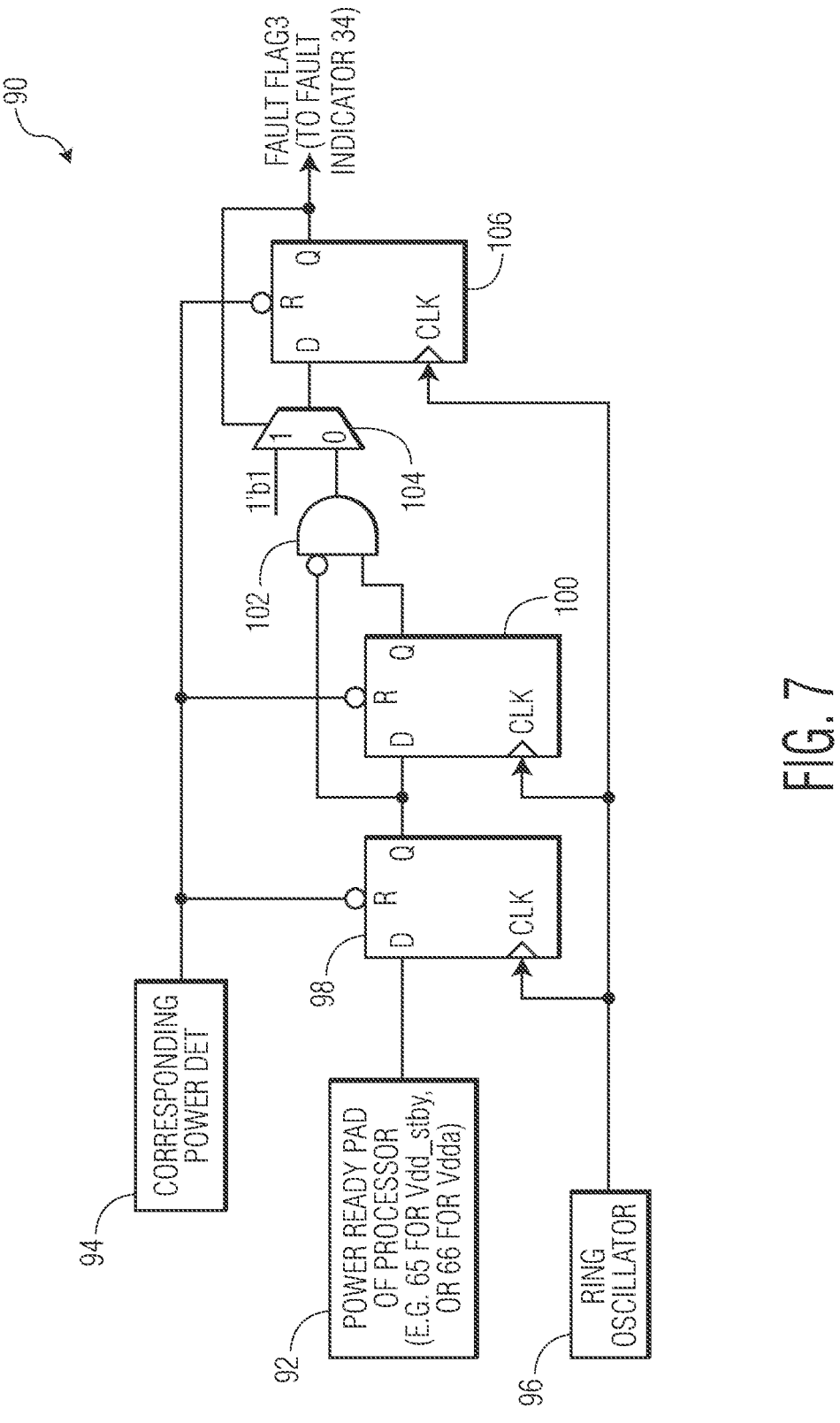

FIG. 7 illustrates, in block diagram form, a portion 90 of fault detection circuit 32, in accordance with one embodiment of the present invention, which detects the fault corresponding to FLAG3, and selectively asserts FLAG3 accordingly. As described above, only a logic level zero to logic level one transition is expected on the power ready signal (e.g. POR_B or PMIC_Vdd_OK), and therefore, if a logic level one to logic level zero transition occurs, instability of the power ready signal is indicated. Therefore, in one embodiment, if a logic level one to a logic level zero transition is observed after the corresponding power detector is asserted to indicate the presence of a supply voltage on the corresponding power supply pad, a possible malfunction is indicated and portion 90 asserts FLAG 3 and locks itself. Portion 90 includes a power ready pad 92 of processor 12, asynchronous reset flip flops 98, 100, and 106, an AND gate 102, a multiplexor (MUX) 104, a corresponding power detector (det) 94, and a ring oscillator 96. Like pads 72 and 82, pad 92 may correspond to either POR_B pad 65 or PMIC_Vdd_OK pad 66, and corresponding power det 94 can be the power detector corresponding to the power supply pad of a power domain being monitored. Therefore, in the case of pad 65, corresponding power det 86 may correspond to power det 30 which monitors Vdd_stby at pad 28, and in the case of pad 66, corresponding power det 86 may correspond to power det 42 which monitors Vdda at pad 40.

The output of corresponding power det 94 is provided to the inverted reset (R) inputs of flip flops 98, 100, and 106, such that when the output of corresponding power det 94 is provided as a zero, the Q outputs of flip flops 98, 100, and 106 are all reset to zero. An on-chip ring oscillator 96 (which can be any type of oscillator) provides a clock signal to the clock inputs of flip flops 98, 100, and 106. A D input of flip flop 98 is coupled to power ready pad 92. A Q output of flip flop 98 is coupled to a D input of flip flop 100 and to an inverted input of AND gate 102. A Q output of flip flop 100 is coupled to a non-inverted input of AND Gate 102. A logic level one (designated as "1'b1") is provided to a first data input of MUX 104, and an output of gate 102 is coupled to a second data input of MUX 104. A D input of flip flop 106 is coupled to an output of MUX 104, and a Q output of flip flop 106 is provided to a control input of MUX 104 and is provided as Fault FLAG3 for storage into fault indicator 34.

In operation, corresponding power det 94, prior to detecting the presence of a power supply voltage on it corresponding voltage supply pad, provides a zero to each of the R inputs, resetting the Q outputs of flip flops 98, 100, and 106 to zero. Flip flops 98, 100, and 106 remain in the reset state so long as the output of power det. 94 remains negated. Once the output of corresponding power det 94 is asserted to a logic level one upon detecting the presence of a power supply voltage on its corresponding power supply pad, the Q output of flip flop 106 provided to the control input of MUX 104 controls what is provided to the D input of flip flop 106. When the control input of MUX 104 is a logic level zero, the output of AND gate 102 is stored into flip flop 106 at the next active edge (e.g. rising edge) of the clock signal from ring oscillator 96, and when the control input of MUX 104 is a logic level one, the fixed logic level one at the first data input of MUX 104 is stored into flip flop 106 at the next active edge of the clock signal. Therefore, so long as the Q output of flip flop 106 remains a zero, the output of AND gate 102 is stored into flip flop 106 at the active edges of the clock signal at the clock input of flip flop 106. However, once the Q output of flip flop 106 transitions to a logic level one, the Q output remains at a logic level one, regardless of the value at the output of AND gate 102.

While the input provided by pad 92 is a logic level zero, with each active clock edge of the clock signal from ring oscillator 96, both flip flops 98 and 100 store a zero (and thus provide their Q outputs as zeros to the inputs of AND gate 102). The second input receives the logic level zero from the Q output of flip flop 100, and therefore, the output of AND gate 102, which is provided to the D input of flip flop 106 via the second data input of MUX 104, also remains at zero. In this case, fault FLAG3 is at zero, indicating no fault. If a logic level zero to logic level one transition occurs on pad 92 (assuming the output of corresponding power det 94 has already been asserted to a logic level one), a logic level one is stored into flip flop 98 while a zero is stored into flip flop 100 upon the next active edge of the clock signal from ring oscillator 96. In this case, the Q output of flip flop 98 is provided as a logic level one to the inverted input of AND gate 102, such that it is inverted to a zero. The second input remains a zero, and thus the output of AND gate 102 also remains a zero, and fault FLAG3 remains a zero, indicating no fault detected. The logic level zero to logic level one transition after assertion of the output of corresponding power det 94 is an expected transition, therefore, fault FLAG3 is not asserted to a logic level one in response to this transition.

However, a logic level one to logic level zero transition after assertion of the output of corresponding power det 94 is not expected. With the logic level one to logic level zero transition, the logic level zero is stored into flip flop 98 and the logic level one is shifted into flip flop 100. In this case, since the logic level zero is inverted at the first input of AND gate 102 to a logic level one and the Q output of flip flop 100 at the second input of AND gate 102 is also a logic level one, the output of AND gate 102 is asserted to a logic level one. In this case, at the next active edge of the clock signal at the clock input of flip flop 106, the logic level one, provided via the second data input of MUX 104 to the D input of flip flop 106, is stored into flip flop 106. The Q output of flip flop 106 is asserted to a logic level one, which is provided as fault FLAG3, indicating detection of the corresponding fault. The logic level one at the Q output of flip flop 106 provided to the control input of MUX 104 also operates to lock circuit 90 such that fault FLAG3 remains at a logic level one, regardless of the input provided by pad 92 and the outputs of AND gate 102.

The combination of the various fault flags described herein for the power ready signals can be used to identify different fault types with the pads of processor 12. For example, referring to POR_B as the power ready signal, if FLAG1 and FLAG3 are negated, and FLAG2 [3:0]="1000," correct behavior of system 10 is indicated (at least with respect to the fault conditions detected by FLAG1, FLAG2, and FLAG3). However, if FLAG1 for POR_B is asserted but FLAG2 [3:0]=0000 and FLAG3 is negated, this may indicate that the POR_B pad is stuck high on the board or that the POR_B has another stuck at high defect. As another example for POR_B, if FLAG1 is asserted and FLAG2 [3:0]="1000" (regardless of the value of FLAG3), this may indicate that the IO resolution voltage for POR_B at pad 65 is too high, which can risk premature startup of the boot clock with a ramping up of Vdd_stby being too slow. In another example, if FLAG2 [3:0] includes more than one "1" and FLAG3 is asserted (regardless of the value of FLAG1), this may indicate that the IO for POR_B at pad 65 is unstable at low voltages, which also risks premature startup of the boot clock at a slow ramping up of Vdd_stby. This may indicate, for example, IO damage due to aging or to floating nodes.

Note that in the above embodiments, each of the D flip flops described in FIGS. 5-7 were illustrated as positive edge flip flops in which the active edge is the rising edge of the clock signal at the clock input. However, alternate embodiments can instead use negative edge flip flops in which the active edge is the falling edge of the clock signal at the clock input. In alternate embodiments, different types of flip flops can also be used in place of the D flip flops, assuming they provide the same functionality. Also, the circuits above may be used to detect fault conditions for pads which receive other power ready signals or reset signals which are received from an external source at signal pads of a chip. These signals may be active high or active low signals, and therefore, instead of detecting particular occurrences or numbers of rising edge transitions of the signals, different embodiments of the circuits above may instead detect particular occurrences or number of falling edge transitions. Similarly, an expected transition of a signal may be either a one to zero logic state transition or a zero to lone logic state transition, depending on the design of the signals. The logic of the circuits above, such as the logic in FIG. 7 which implements the AND gate and MUX, can also be implemented using a different combination of logic gates or logic circuits.

Therefore, by now it can be appreciated how circuitry with an SoC can be used to detect various fault conditions which may occur due to malfunctions at the chip pins or pads of the SoC. These malfunctions can lead to immediate or future failures. For example, in one embodiment, characteristics of signal pads and voltage supply pads within the chip are observed to provide fault indicators which relate to possible faults. For example, a power ready signal or a reset signal can be monitored (e.g. a logic state of the power ready signal or a reset signal can be monitored) with respect to a voltage level of a power supply pad to detect a fault condition. In another example, a series of logic state transitions of the power ready signal or reset signal are monitored to detect a fault condition. The detection of these fault conditions can be logged or can be used to generate different responses, such as, for example, wakeup events or interrupts. In this manner, improved fault detection can be achieved.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a b following the name ("b" or "_b"). In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate multiple signals or conductors (e.g. the conductors of a bus) or the bit locations of a value. For example, "conductors [7:0]" indicates 8 conductors or 8 signals, and "bus 60 [7:0]" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" preceding a number indicates that the number is represented in its binary or base two form. Similarly, "X'b" preceding a number indicates that the number is represented as an X-bit number in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/ dynamic load library and/or other sequence of instructions designed for execution on a computer system.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of processor 12 are circuitry located on a single integrated circuit or within a same device. Alternatively, processor 12, as well as system 10, may include any number of separate integrated circuits or separate devices interconnected with each other. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of system 10, for example, from computer readable media such as memory 35 or other media on other computer systems. Such computer readable media may be permanently, removably or remotely coupled to an information processing system such as system 10. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

Although the invention is described herein with reference to specific embodiments, various modifications and changes can be made without departing from the scope of the present invention as set forth in the claims below. For example, processor 12 may include any number and combination of switchable power domains and always-ON domains. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In one embodiment, a system-on-chip (SoC) includes a first power supply pad configured to provide a first power supply to a power domain of the SoC, wherein the first power supply pad is configured to receive the first power supply from a source external to the SoC; a first signal pad configured to receive a power ready signal from external the SoC which indicates when the first power supply to the power domain is fully powered up; a first power detector coupled to the first power supply pad configured to provide a first power detected output, which, when asserted, indicates presence of a power supply voltage on the first power supply pad; and a fault detection circuit coupled to the first power detector and the first signal pad and configured to generate a set of fault flags in response to monitoring a relationship between the first power detected output and a logic state of the power ready signal. In one aspect of the embodiment, the first power detector is configured to assert the first power detected output to a first logic state when a voltage on the first power supply pad reaches a voltage detection threshold, wherein the voltage detection threshold is less than a voltage level of the first power supply when fully powered up. In a further aspect, the first power detector is configured to negate the first power detected output to a second logic state, opposite the first logic state, when the voltage on the first power supply pad is less than the voltage detection threshold to indicate absence of the power supply voltage on the first power supply pad. In another aspect of the embodiment, the fault detection circuit is configured to generate a first fault flag of the set of fault flags which indicates a fault when the first power detected output is asserted to indicate that a voltage on the first power supply pad is above a voltage supply threshold while the power ready signal is already at a logic level one. In a further aspect, the fault detection circuit includes a non-resettable flip flop having a data input coupled to the first signal pad, a clock input coupled to receive the first power detected output, and a data output configured to provide a stored value of the flip flop as the first fault flag of the set of fault flags, in which the non-resettable flip flop is devoid of a reset input. In another aspect, the fault detection circuit is configured to generate a first fault flag of the set of fault flags which indicates a fault when multiple logic state transitions of the power ready signal occur after the first power detected output is asserted to indicate the presence of the power supply voltage on the first power supply pad. In a further aspect, the fault detection circuit includes a chain of flip flops, in which a first flip flop of the chain of flip flops has a first data input coupled to receive a fixed logic value, remaining flip flops of the chain of flip flops each have a data input coupled to a data output of a previous flip flop in the chain of flip flops, the first power detected output is provided to an inverted reset input of each flip flop of the chain of flip flops, the first signal pad is coupled to a clock input of each flip flop of the chain of flip flops, and data outputs of the flip flops of the chain of flip flops are configured to provide a multi-bit value as the first fault flag of the set of fault flags. In a further aspect, each flip flop of the chain of flip flops is configured to reset when the first power detected output is negated to indicate absence of the power supply voltage on the first power supply pad. In another further aspect, the chain of flip flops includes N flip flops, wherein N is any integer greater than or equal to three, wherein when more than one bit of the multi-bit value provided as the first fault flag has the fixed logic value, the first fault flag indicates occurrence of a fault. In yet another aspect of the embodiment, the fault detection circuit is configured to generate a first fault flag of the set of fault flags which indicates a fault when the power ready signal is detected as being unstable by detecting an unexpected logic transition of the power ready signal after the first power detected output is asserted to indicate the presence of the power supply voltage on the first power supply pad. In a further aspect, the fault detection circuit includes a first flip flop having a data input coupled to the first signal pad, an inverted reset input coupled to receive the first power detected output, and a clock input coupled to receive a clock signal; a second flip flop having a data input coupled to a data output of the first flip flop, an inverted reset input coupled to receive the first power detected output, and a clock input coupled to receive a clock signal; a third flip flop having a data output configured to provide a stored value of the flip flop as the first fault flag of the set of fault flags, and a clock input coupled to receive a clock signal; and a logic circuit configured to, when the data output of the third flip flop has a first logic state, provide a fixed logic value to a data input of the third flip flop, and, when the data output of the third flip flop has a second logic state, opposite the first logic state, provide a logical combination of the data outputs of the first and second flip flops to the data input of the third flip flop. In a further aspect, the logical combination comprises an AND of an inverted version of the data output of the first flip flop and a data output of the second flip flop. In another aspect of the embodiment, the power ready signal is a power-on-reset signal, which, when released, indicates completion of power up of the SoC during which the first power supply to the power domain has been fully powered up. In a further aspect, the first power supply is a continuous power supply and the power domain is an always-on power domain which is not powered down during standby mode of the SoC. In yet another aspect, the external source comprises a power management circuit external to the SoC, wherein the power ready signal is a power management signal which, when asserted, indicates completion of at least a portion of a wakeup procedure from a standby mode during which the first power supply to the power domain has been fully powered up. In a further aspect, the first power supply is a switchable power supply which is powered down during the standby mode of the SoC.

In another embodiment, a system-on-chip (SoC) includes a first power supply pad configured to provide a first power supply to a power domain of the SoC, wherein the first power supply pad is configured to receive the first power supply from a power management circuit external to the SoC; a first signal pad configured to receive a first reset signal from the power management circuit which, when released, indicates that the first power supply to the power domain is fully powered up; a first power detector coupled to the first power supply pad configured to provide a first power detected output, which, when asserted, indicates presence of a power supply voltage on the first power supply pad; and a fault detection circuit coupled to the first power detector and the first signal pad. The fault detection circuit is configured to generate a first fault flag which indicates a first fault when the first power detected output is asserted to indicate presence of the power supply voltage on the first power supply pad while the power ready signal is already at a logic level one, and generate a second fault flag which indicates a second fault when multiple logic state transitions of the reset signal occurs after the first power detected output is asserted to indicate presence of the power supply voltage on the first power supply pad. In one aspect of the another embodiment, the first power detector is configured to assert the first power detected output to a first logic state when a voltage on the first power supply pad reaches a voltage detection threshold, wherein the voltage detection threshold is less than a voltage level of the first power supply when fully powered up. In a further aspect, the power domain is an always-on power domain of the SoC which is not powered down during a standby mode, and the first signal pad, first power detector, and the fault detection circuit are in the always-on power domain. In yet a further aspect, when the second fault flag indicates the second fault, a logic state of the first reset signal resolves when first power supply voltage reaches a voltage supply threshold while powering up, wherein the voltage supply threshold is greater than the voltage detection threshold.

What is claimed is:

1. A system-on-chip (SoC) comprising:
a first power supply pad configured to provide a first power supply to a power domain of the SoC, wherein the first power supply pad is configured to receive the first power supply from a source external to the SoC;
a first signal pad configured to receive a power ready signal from external the SoC which indicates when the first power supply to the power domain is fully powered up;
a first power detector coupled to the first power supply pad configured to provide a first power detected output, which, when asserted, indicates presence of a power supply voltage on the first power supply pad; and
a fault detection circuit coupled to the first power detector and the first signal pad and configured to generate a set of fault flags in response to monitoring a relationship between the first power detected output and a logic state of the power ready signal, wherein the fault detection circuit is configured to generate a first fault flag of the set of fault flags which indicates a fault when the first power detected output is asserted to indicate that a voltage on the first power supply pad is above a voltage supply threshold while the power ready signal is already at a logic level one, and the fault detection circuit further comprises:
a non-resettable flip flop having a data input coupled to the first signal pad, a clock input coupled to receive the first power detected output, and a data output configured to provide a stored value of the flip flop as the first fault flag of the set of fault flags, wherein the non-resettable flip flop is devoid of a reset input.

2. The SoC of claim 1, wherein the first power detector is configured to assert the first power detected output to a first logic state when a voltage on the first power supply pad reaches a voltage detection threshold, wherein the voltage detection threshold is less than a voltage level of the first power supply when fully powered up.

3. The SoC of claim 2, wherein the first power detector is configured to negate the first power detected output to a second logic state, opposite the first logic state, when the voltage on the first power supply pad is less than the voltage detection threshold to indicate absence of the power supply voltage on the first power supply pad.

4. The SoC of claim 1, wherein the power ready signal is a power-on-reset signal, which, when released, indicates completion of power up of the SoC during which the first power supply to the power domain has been fully powered up.

5. The SoC of claim 4, wherein the first power supply is a continuous power supply and the power domain is an always-on power domain which is not powered down during standby mode of the SoC.

6. The SoC of claim 1, wherein the external source comprises a power management circuit external to the SoC, wherein the power ready signal is a power management signal which, when asserted, indicates completion of at least a portion of a wakeup procedure from a standby mode during which the first power supply to the power domain has been fully powered up.

7. The SoC of claim 6, wherein the first power supply is a switchable power supply which is powered down during the standby mode of the SoC.

8. A system-on-chip (SoC) comprising:
a first power supply pad configured to provide a first power supply to a power domain of the SoC, wherein the first power supply pad is configured to receive the first power supply from a source external to the SoC;
a first signal pad configured to receive a power ready signal from external the SoC which indicates when the first power supply to the power domain is fully powered up;
a first power detector coupled to the first power supply pad configured to provide a first power detected output, which, when asserted, indicates presence of a power supply voltage on the first power supply pad; and
a fault detection circuit coupled to the first power detector and the first signal pad and configured to generate a set of fault flags in response to monitoring a relationship between the first power detected output and a logic state of the power ready signal, wherein the fault detection circuit is configured to generate a first fault flag of the set of fault flags which indicates a fault when multiple logic state transitions of the power ready signal occur after the first power detected output is asserted to indicate the presence of the power supply voltage on the first power supply pad, wherein the fault detection circuit comprises a chain of flip flops, wherein:
a first flip flop of the chain of flip flops has a first data input coupled to receive a fixed logic value,
remaining flip flops of the chain of flip flops each have a data input coupled to a data output of a previous flip flop in the chain of flip flops,
the first power detected output is provided to an inverted reset input of each flip flop of the chain of flip flops,
the first signal pad is coupled to a clock input of each flip flop of the chain of flip flops, and
data outputs of the flip flops of the chain of flip flops are configured to provide a multi-bit value as the first fault flag of the set of fault flags.

9. The SoC of claim 8, wherein each flip flop of the chain of flip flops is configured to reset when the first power detected output is negated to indicate absence of the power supply voltage on the first power supply pad.

10. The SoC of claim 8, wherein the chain of flip flops includes N flip flops, wherein N is any integer greater than or equal to three, wherein when more than one bit of the multi-bit value provided as the first fault flag has the fixed logic value, the first fault flag indicates occurrence of a fault.

11. The SoC of claim 8, wherein the first power detector is configured to assert the first power detected output to a first logic state when a voltage on the first power supply pad reaches a voltage detection threshold, wherein the voltage detection threshold is less than a voltage level of the first power supply when fully powered up.

12. The SoC of claim 11, wherein the first power detector is configured to negate the first power detected output to a second logic state, opposite the first logic state, when the voltage on the first power supply pad is less than the voltage detection threshold to indicate absence of the power supply voltage on the first power supply pad.

13. The SoC of claim 8, wherein the power ready signal is a power-on-reset signal, which, when released, indicates completion of power up of the SoC during which the first power supply to the power domain has been fully powered up.

14. The SoC of claim 13, wherein the first power supply is a continuous power supply and the power domain is an always-on power domain which is not powered down during standby mode of the SoC.

15. The SoC of claim 8, wherein the external source comprises a power management circuit external to the SoC, wherein the power ready signal is a power management signal which, when asserted, indicates completion of at least a portion of a wakeup procedure from a standby mode during which the first power supply to the power domain has been fully powered up.

16. The SoC of claim 15, wherein the first power supply is a switchable power supply which is powered down during the standby mode of the SoC.

17. A system-on-chip (SoC) comprising:
  a first power supply pad configured to provide a first power supply to a power domain of the SoC, wherein the first power supply pad is configured to receive the first power supply from a source external to the SoC;
  a first signal pad configured to receive a power ready signal from external the SoC which indicates when the first power supply to the power domain is fully powered up;
  a first power detector coupled to the first power supply pad configured to provide a first power detected output, which, when asserted, indicates presence of a power supply voltage on the first power supply pad; and
  a fault detection circuit coupled to the first power detector and the first signal pad and configured to generate a set of fault flags in response to monitoring a relationship between the first power detected output and a logic state of the power ready signal, wherein the fault detection circuit is configured to generate a first fault flag of the set of fault flags which indicates a fault when multiple logic state transitions of the power ready signal occur after the first power detected output is asserted to indicate the presence of the power supply voltage on the first power supply pad,
  wherein the fault detection circuit comprises:
    a first flip flop having a data input coupled to the first signal pad, an inverted reset input coupled to receive the first power detected output, and a clock input coupled to receive a clock signal;
    a second flip flop having a data input coupled to a data output of the first flip flop, an inverted reset input coupled to receive the first power detected output, and a clock input coupled to receive a clock signal;
    a third flip flop having a data output configured to provide a stored value of the flip flop as the first fault flag of the set of fault flags, and a clock input coupled to receive a clock signal; and
    a logic circuit configured to:
      when the data output of the third flip flop has a first logic state, provide a fixed logic value to a data input of the third flip flop, and
      when the data output of the third flip flop has a second logic state, opposite the first logic state, provide a logical combination of the data outputs of the first and second flip flops to the data input of the third flip flop.

18. The SoC of claim 17, wherein the logical combination comprises an AND of an inverted version of the data output of the first flip flop and a data output of the second flip flop.

19. The SoC of claim 17, wherein the first power detector is configured to assert the first power detected output to a first logic state when a voltage on the first power supply pad reaches a voltage detection threshold, wherein the voltage detection threshold is less than a voltage level of the first power supply when fully powered up.

20. The SoC of claim 19, wherein the first power detector is configured to negate the first power detected output to a second logic state, opposite the first logic state, when the voltage on the first power supply pad is less than the voltage detection threshold to indicate absence of the power supply voltage on the first power supply pad.

21. The SoC of claim 17, wherein the power ready signal is a power-on-reset signal, which, when released, indicates completion of power up of the SoC during which the first power supply to the power domain has been fully powered up.

22. The SoC of claim 21, wherein the first power supply is a continuous power supply and the power domain is an always-on power domain which is not powered down during standby mode of the SoC.

23. The SoC of claim 17, wherein the external source comprises a power management circuit external to the SoC, wherein the power ready signal is a power management signal which, when asserted, indicates completion of at least a portion of a wakeup procedure from a standby mode during which the first power supply to the power domain has been fully powered up.

24. The SoC of claim 23, wherein the first power supply is a switchable power supply which is powered down during the standby mode of the SoC.

* * * * *